United States Patent [19]
Borland

[11] Patent Number: 5,936,407
[45] Date of Patent: *Aug. 10, 1999

[54] INTRAVEHICULAR AUTO HARNESS INTEGRITY TESTER WITH SWITCH

[76] Inventor: Leslie R. Borland, Six Signal Hill Rd., Lake Placid, N.Y. 12946

[ * ] Notice: This patent is subject to a terminal disclaimer.

[21] Appl. No.: 08/885,170

[22] Filed: Jun. 30, 1997

[51] Int. Cl.$^6$ .................................................. G01R 31/02
[52] U.S. Cl. ......................................... 324/504; 324/556
[58] Field of Search ................................. 324/539, 503, 324/504, 133, 66, 556, 542

[56] References Cited

U.S. PATENT DOCUMENTS

| | | | |
|---|---|---|---|
| 3,566,401 | 2/1971 | Smith | 324/503 |
| 3,663,939 | 5/1972 | Olsson | 324/504 |
| 4,166,242 | 8/1979 | Spiteri | 324/504 |
| 4,249,125 | 2/1981 | Carver | 324/504 |
| 4,547,722 | 10/1985 | Sarlo | 324/504 |
| 5,095,276 | 3/1992 | Nepil | 324/504 |
| 5,604,439 | 2/1997 | Walkington | 324/504 |
| 5,635,843 | 6/1997 | Borland | 324/504 |

FOREIGN PATENT DOCUMENTS

| | | | |
|---|---|---|---|
| 1558565 | 1/1980 | United Kingdom | 324/504 |

Primary Examiner—Maura Regan
Attorney, Agent, or Firm—John J Welch, Jr. Esq.

[57] ABSTRACT

An intravehicular auto harness tester with switch consisting of a first housing unit mountable within or upon the dashboard of a motor vehicle containing three small light emitting diodes with wiring leading thereto and therefrom coupled with one resistor per diode, with such wiring entering the housing unit and leaving it by way of a coaxial cable leading to or from a second housing unit located typically in the trunk of the vehicle with three prongs and female socket pocket at a front end of the second housing unit for interfacing with an intravehicular auto harness power plug and with three female socket pockets and a prong at a rear end thereof for interfacing with a trailer harness plug and with wiring therein running from prongs to socket pockets and via junctions along such wiring also from the front end prongs to wiring in the coaxial cable leading to the diodes and a ground wire within the cable leading via an off/on switch from the diodes to the front end socket pocket of the second housing unit along with a ground wire within the second housing unit leading from the prong at the rear end thereof.

12 Claims, 3 Drawing Sheets

INTRAVEHICULAR AUTO HARNESS INTEGRITY TESTER WITH SWITCH

CROSS REFERENCES TO PRIOR APPLICATIONS

There are no prior or parent applications related to the instant application or invention.

FEDERALLY SPONSORED RESEARCH AND DEVELOPMENT

There is no federally sponsored research and development related to the instant invention.

BACKGROUND OF THE INVENTION

1. Field of the Invention

The instant invention relates to that class of devices that serve to test conductivity of wiring in vehicles where such wiring via a harness unit, so-called ultimately connects a power source within such vehicles to the rear lights on trailer vehicles amenable to being towed by such vehicles.

2. Prior Art

The following references are to be found within the particular field of the instant invention, but he claims and specifications set forth therein do not anticipate those that are endemic to the instant invention:

| Inventor | Invention | Pat. No. | Date |
|---|---|---|---|
| Whisenand | Electrical Tester with Electrical Energizable Test Probe | 5,367,250 | 1/22/94 |
| Jeter | Trailer Light Converter | 4,781,393 | 11/1/88 |
| Schneider, III | Compact Lamp and Circuit Tester for Vehicles, Particularly Automobiles | 5,278,511 | 1/11/94 |
| Lieu et al. | Portable Apparatus for Testing Multi-Harness and Electrical Assemblies to Identify Wiring Errors | 5,250,908 | 10/5/93 |
| Lemon | Apparatus for Determining Wiring Orientation at Electrical Connectors Including Plural Light Indicators and Rotary Switch | 5,192,912 | 3/9/93 |
| McConchie Sr. | Diagnostic Test Apparatus for Electrical System of Automotive Vehicle | 4,884,033 | 11/28/89 |
| Butchko | Vehicle Light Testing System for Testing a Plurality of Lights Using a Scanning Sequence | 4,866,390 | 9/12/89 |
| Borland | Auto Harness Integrity Tester | 5,635,843 | 6/3/97 |

A SUMMARY OF THE INVENTION

A Brief Description of the Invention

The instant invention consists of a first housing unit that is typically mounted in, about or on the dash of a motor vehicle or, alternatively on another surface within the ready view of the driver of such a vehicle when the driver is seated in the driver's seat of the vehicle. Within this housing unit there are three (3) small light emitting diodes therein held stationary and connected one each to a first end of one resistor, one diode per resistor. Each diode is likewise connected to a fourth ground wire. A second embodiment features connection of diodes to a ground wire via the resistors that are themselves connected to ground. Each resistor has wiring connected to a second end of each that, up to the point of entry into the housing unit is along with the ground wiring housed within a coaxial cable unit. The second embodiment has wiring connecting directly to the diodes upon entry into the housing unit from within the coaxial cable. The housing unit is also equipped with a switch component for purposes of facilitating the flow of current from a power source to each of the diodes. In respect of each embodiment, the cable and wiring enclosed therein runs through and within the vehicle from within a second housing unit located typically in the trunk of the vehicle. Within the second housing unit there is further wiring. The second housing unit has at one i.e., first end, a set of three identical male prongs and a female socket pocket and at a second end, three female socket pockets and one male prong. The first end of the second housing unit is meant to interface frontwise with a power plug portion of a typical auto harness emanating from an intravehicular power source which said plug typically has three female socket pockets and one male prong. The second end of this housing unit with its three female socket pockets and one male prong is meant to interface rearwise with the three male prongs and one female socket pocket of a typical trailer plug connected by wiring to lights at the rear of a trailer unit being hooked to the rear of the vehicle. Wiring within the second housing unit leads from prongs to pockets and from a site on each piece of such wiring, being a junction thereat, to the wiring within the coaxial cable. In this manner, power is transmitted from the auto harness via the wiring in the second housing unit and simultaneously, when the switch in the first housing unit is in an on position, to the diodes therein located.

Objects of the Invention

It is inconvenient and time consuming to be required to walk behind a trailer vehicle being hauled by a motor vehicle to check to see if its rear running and, parking lights and then right rear braking and directional lights and left rear braking and directional lights are working and upon observing failure in either one or more these systems to then be required to ascertain via continuing walking around and inspecting whether such failure is due to failure within the vehicle or vehicle's power harness or within the bulbs or wiring of the trailer vehicle itself. Invariably, diagnosis in any such event requires an unhooking of the trailer vehicle from the vehicle and a rechecking of the above-mentioned systems within the vehicle itself. However, utilization of the instant invention will very quickly and expeditiously enable one to ascertain whether there are vehicle or harness problems with respect to such systems. Without ever leaving the vehicle, one can simply check to see if all three such systems on the vehicle or harness are working merely by viewing the switched on dashboard diodes of the instant invention as the appropriate activation switches relating to each of such systems are respectively turned on, then off. Once it is clear that all such systems are properly working, then, the appropriate activation switches can once again, be turned on one at a time to discern, via one walk around inspection only, operability or not of the corresponding lighting systems in the rear of the trailer vehicle.

Respectfully submitted, the instant invention is a very simple, uniquely inexpensive and convenient device that facilitates quick and ready diagnosis initially from within the vehicle itself of the actual source of any such rear light systems problem should there prove to be any and as such the instant invention constitutes a rather marked improvement over the current art regarding such devices.

A DESCRIPTION OF THE DRAWINGS

A DESCRIPTION OF THE PREFERRED EMBODIMENT

Figure 1:
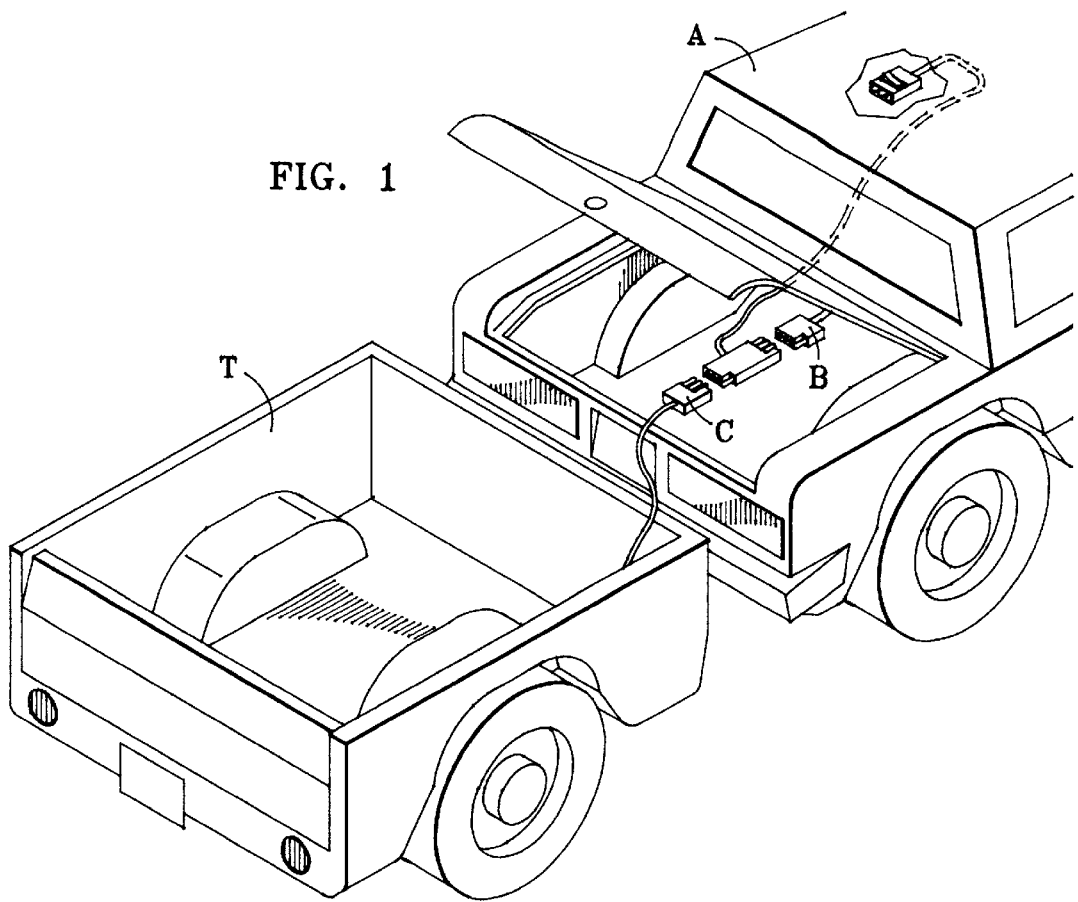
FIG. 1 shows a motor vehicle and a trailer affixable thereto in apposition to the motor vehicle as well as showing the instant invention positioned within the motor vehicle.
Figure 2:
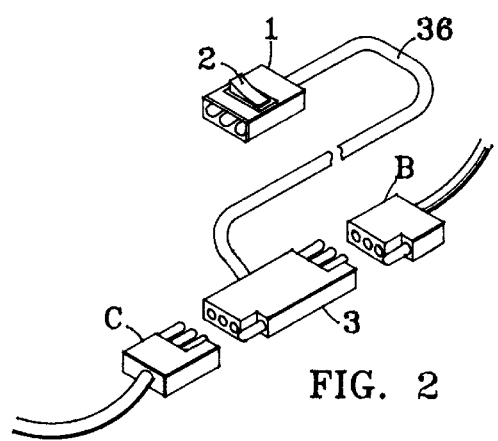
FIG. 2 is an isolated perspective view of the instant invention in apposition to the plug of an auto harness and in apposition to the plug of a trailer harness.
Figure 3:
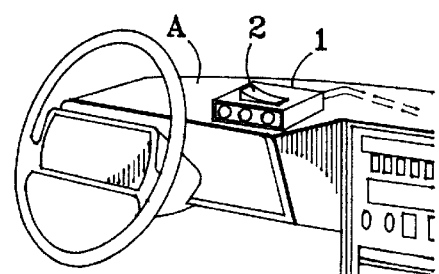
FIG. 3 shows the testing portion of the instant invention positioned in proximity to the steering wheel of a motor vehicle.
Figure 4:
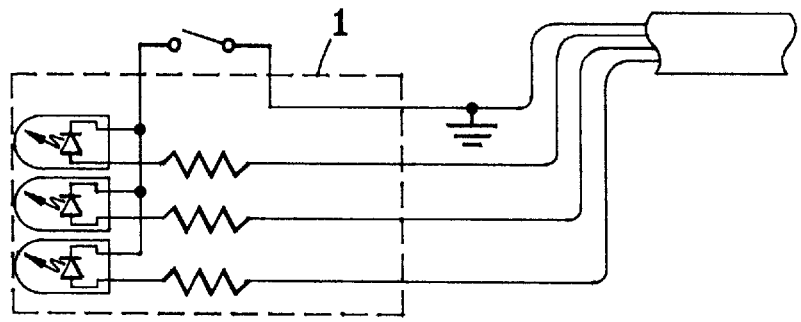
FIG. 4 is a schematic drawing of a first embodiment of the instant invention.
Figure 5:
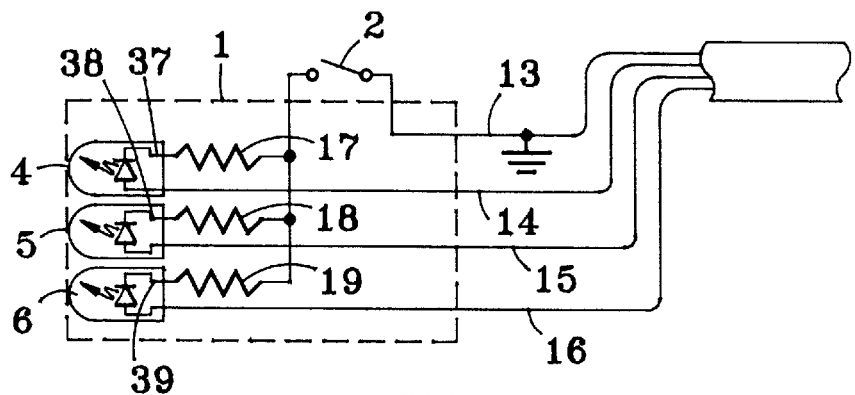
FIG. 5 is a schematic drawing of a second embodiment of the instant invention.
Figure 6:
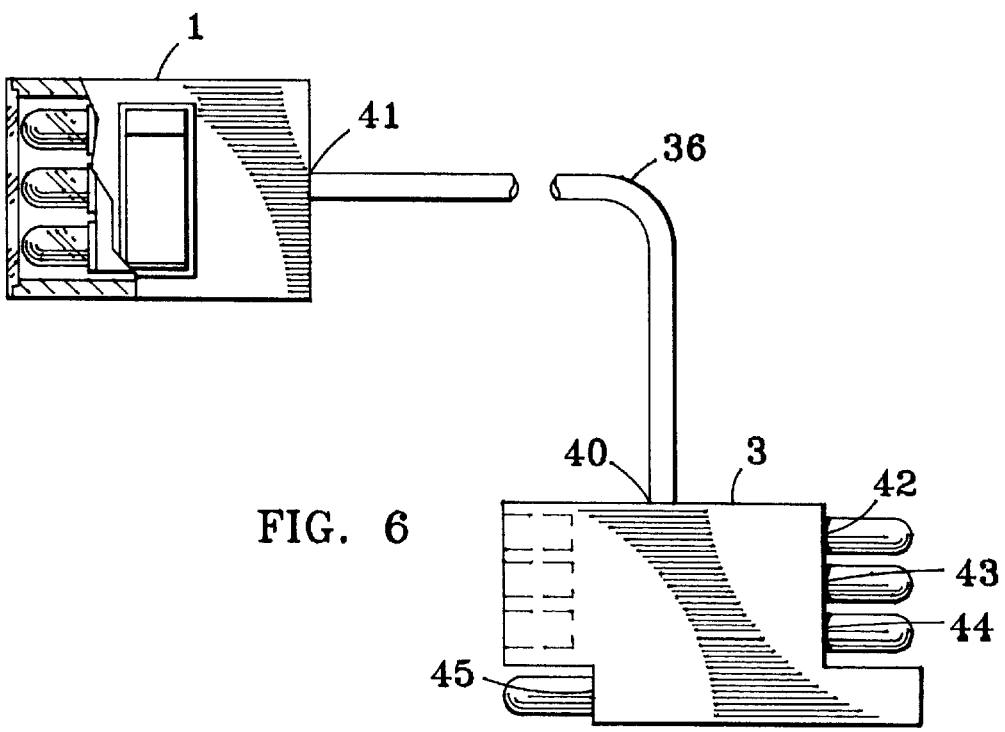
FIG. 6 is a broken plan view of the exterior portions of the instant invention.
Figure 7:
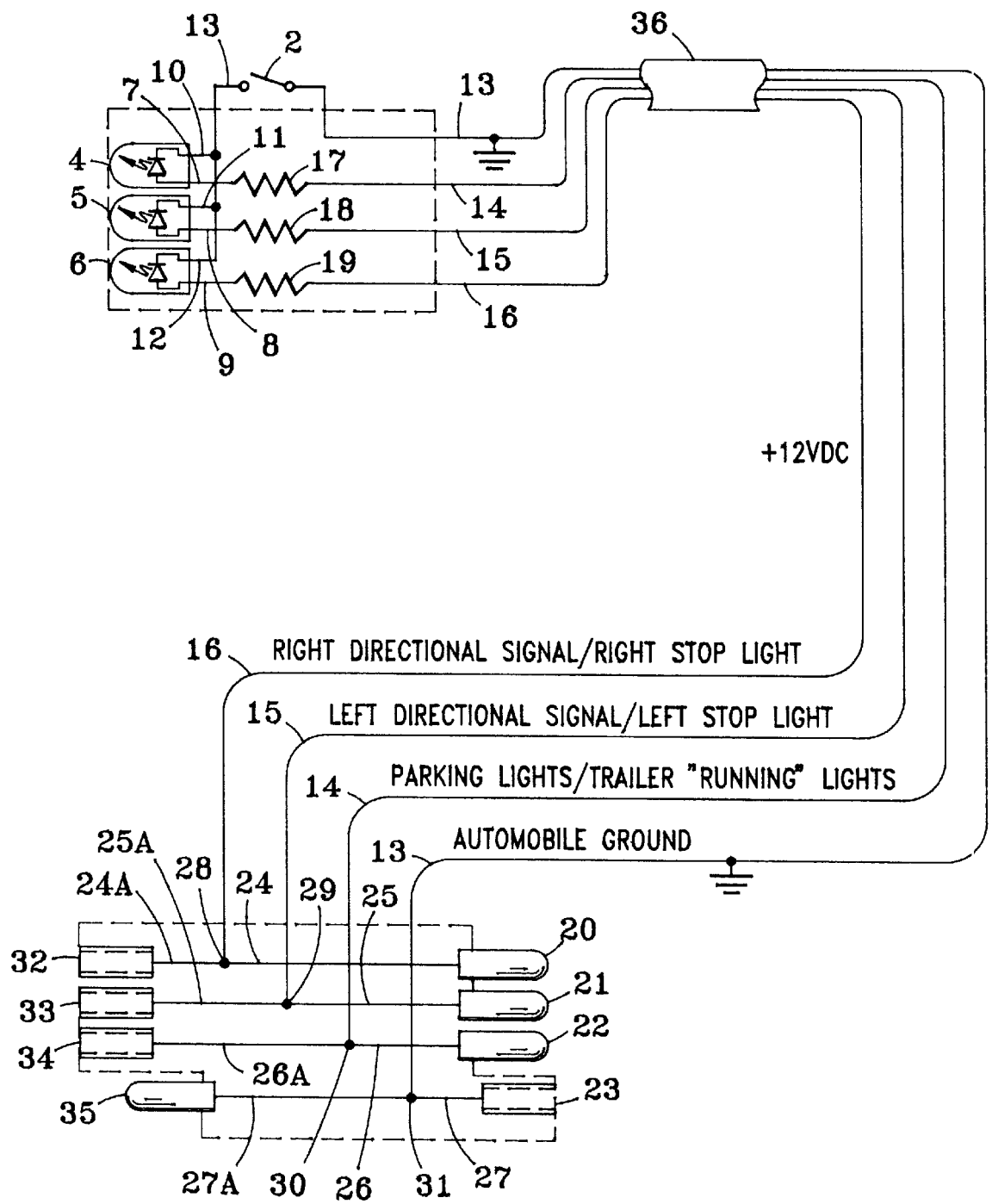
FIG. 7 is a schematic drawing of the whole of the first embodiment of the instant invention.

FIG. 1 shows a motor vehicle A equipped with the instant invention with a trailer T in apposition to it. Also there seen is an auto harness B and a trailer harness C. A power source from within the motor vehicle via harness B transmits electric power to the instant invention and that power is, by virtue of the wiring within housing component 3 of the instant invention, amenable to passage into harness C for purposes of ultimately activating rear lighting on trailer T simultaneously with passage via wiring within cable 36 of electric power to the region of diodes held within housing component 1 of the instant invention when switch 2 is in an on position. FIG. 2 is an isolated perspective view of housing component 3 of the instant invention in apposition to an auto harness B and a trailer harness D. Also therein seen is cable 36 emanating from housing component 3 and into housing, component 1 equipped with switch 2. FIG. 3 shows the testing portion of the instant invention positioned in proximity to the steering wheel of motor vehicle A. FIGS. 4 and 5 are schematic diagrams of the contents of housing component 1 in one embodiment of the instant invention and then in a second embodiment thereof. The two embodiments differ from one another only in respect of the entry or exit from housing component 1 of power input wiring that in the case of the first embodiment encounters resistors before encountering diodes and, in the case of the second resistor encounters diodes before encountering resistors. FIG. 6 is a broken plan view of the housing components 1 and 3 of the instant invention joined by cable 36. FIG. 7 is a schematic depiction of the whole of first embodiment of the instant invention. It is with resort to FIG. 7 that an appreciation of the manner in which the instant invention operates can best be obtained.

As per FIG. 7, one notes identical male prongs 20, 21 and 22 each affixed within and emanating respectively from holes 42, 43 and 44 seen in FIG. 6 in a front side of housing component 3 depicted schematically along with a female socket pocket 23. These prongs and this socket pocket interface and interconnect with three identical female socket pockets and a male prong of an auto harness B of a motor vehicle A to accept and ultimately permit a run to ground of electric power originating from an intravehicular power source via harness B within motor vehicle A. The power emanating from harness B is transmitted via prongs 20, 21 and 22 via wires 24, 25 and 26 connected to interior ends of prongs 20, 21 and 22 respectively within housing unit 3 to nodes or junctions 28, 29 and 30 respectively and from there along wires 24A, 25A and 26A to metallic bases of female socket pockets 32, 33 and 34 emanating from a rear side of housing unit 3 which interface and interconnect with three male prongs respectively in trailer harness C for the purpose of permitting transmission of the electric power via wiring in the trailer to the rear lighting of trailer T. The power so transmitted runs to ground therefrom via a socket pocket in harness T and then via male prong 35 interconnected therewith via a hole 45 seen in FIG. 6 in the rear side of housing component 3 and from an interior end thereof via wire 27 connected thereto leading therefrom to junction 31 and then connected via a wire 27A to a metallic base of female socket pocket 23 which in turn interfaces and is interconnected with the male prong on harness B leading via harness B to ground within motor vehicle A. The electric power is simultaneously transmitted to and then from the loci of nodes or junctions 28, 29 and 30 via wires 14, 15 and 16 located within coaxial cable 36 from within housing component 3 through a cable hole 40 in a side of housing component 3 whereat cable 36 connects and then into a cable hole 41 whereat cable 36 once again connects in an end side of housing component 1 wherein wires 14, 15 and 16 through which the power flows, for a first embodiment of the invention, are connected to ends of resistors 17, 18 and 19 respectively. A cable hole 38 could be found in the lateral side of housing component 1 instead of an end side thereof. The loci of each of these two cable holes are appreciated with resort to a viewing of FIG. 6. The power through the resistors reaches wires 7, 8 and 9 connected at opposite ends respectively of the resistors, that then connect respectively to diodes 4, 5 and 6 for the purpose of transmitting power thereto. The power when it reaches, the diodes while switch 2 is in the on position causes the diodes to light up. Wires 10, 11 and 12 emanating respectively from diodes 4, 5 and 6 connect via wire 13 to permit the flow of power from the diodes over switch 2, a typical SPTS switch, to ground when switch 2 is in the on position. Wire 13 runs via coaxial cable 36 back into housing unit 3 where at node or junction 31, return therein carried coupled with return within wire 27 passes via female socket pocket 23 to ground.

For a second embodiment of the invention as noted with reference to FIG. 5, wires 14, 15 and 16 transmit power directly into diodes 4, 5 and 6 within housing component 1. Wires 37, 38 and 39 thereof leading from diodes 4, 5, and 6 respectively connect up with resistors 17, 18 and 19 serving to transmit electric power to wire 13 nodally connected to each resistor at the ends thereof opposite to the ends connected to wires 37, 38 and 39. Wire 13 via switch 2 carries the return from such power to ground in the same manner as described regarding the first embodiment.

The diodes of both embodiments are light emitting and are typically each colored differently and are each characterized by an optoelectric current carrying capacity of 10 milliamps. One diode serves to indicate the functional viability of the power source within motor vehicle A and the pathway therefrom within harness B relating to parking lights, running lights ultimately at the rear of trailer T. A second diode serves to indicate the functional viability of the power source within motor vehicle A and the pathway therefrom within harness relating to a left directional signal, left stop light ultimately at the rear of trailer T. A third diode serves to B indicate the functional viability of the power source within motor vehicle A and the pathway therefrom within harness B relating to a right directional signal, right stop light ultimately at the rear of trailer T. The resistors of each embodiment are all characterized by a resistivity of 1.0 kilohms or a resistivity within a range of 0.70 to 1.30 kilohms.

In conclusion, respectfully submitted, the instant device is indeed novel and unique whereas it permits the continuous testing during operation of a motor vehicle of the integrity of an automobile harness for purposes of transmitting power to the rear lighting of a trailer vehicle being towed by the automobile.

What is claimed is:

1. An intravehicular auto harness integrity tester with switch for testing the functioning of an auto harness from within a moving or non-moving motor vehicle, comprising:

a. a first housing component located upon a driver's side portion of a dashboard of a motor vehicle with a first cable through hole in one side thereof with one end side thereof being closed and transparent;

b. coaxial cable carrying within it, a first wire, a second wire, a third wire and a fourth wire;

c. said coaxial cable connected to said first housing component at the locus of said first cable through hole;

d. a second housing component located in a trunk portion of said motor vehicle with three identical front male prongs affixed thereto and originating respectively from each of three through holes at a front side thereof and a front female socket pocket originating from said front side thereof, with three identical rear female socket pockets originating from a rear side thereof and a rear male prong affixed thereto and originating from a through hole in said rear side thereof and with a second cable through hole in one lateral side thereof;

e. said coaxial cable after passing through an interior region of said motor vehicle and then into said trunk portion of said motor vehicle being then and there connected to said second housing component at the locus of said second cable through hole;

f. a fifth wire leading from a metallic base of said front female socket pocket within said second housing component to an interior end of said rear male prong located within said second housing component;

g. a sixth wire leading from an interior end within said second housing component of a first one of said three identical front male prongs to a metallic base of a first one of said identical rear female socket pockets;

h. a seventh wire leading from an interior end within said second housing component of a second one of said three identical front male prongs to a metallic base of a second one of said identical rear female socket pockets;

i. an eighth wire leading from an interior end with said second housing component of a third one of said three identical male prongs to a metallic base of a third one of said identical rear female socket pockets;

j. a first junction whereat said first wire is connected to said sixth wire within said second housing component;

k. a second junction whereat said second wire is connected to said seventh wire within said second housing component;

l. a third junction whereat said third wire is connected to said eighth wire within said second housing component;

m. a fourth junction whereat said fourth wire is connected to said fifth wire within said second housing component;

n. said first wire being connected to a first resistor within said first housing component;

o. said second wire being connected to a second resistor within said first housing component;

p. said third wire being connected to a third resistor within said first housing component;

q. said first resistor being connected via a ninth wire to a first light emitting diode located within and internally affixed to said first housing component at said end side thereof being closed and transparent;

r. said second resistor being connected via a tenth wire to a second light emitting diode located within and internally affixed to a said first housing component at said end side thereof being closed and transparent;

s. said third resister being connected via an eleventh wire to a third light emitting diode locate within and internally affixed to said first housing component at said end side thereof being closed and transparent;

t. each of said diodes being further connected respectively via a twelfth wire to a first end of an intravehicular off/on testing switch located upon said first housing component;

u. a second end of said intravehicular off/on testing switch being connected to said fourth wire;

v. said resistors being all characterized by resistivity of 1.0 kilohms, and;

w. said light emitting diodes being all characterized by optoelectric current carrying capacity of 10 milliamps.

2. An intravehicular auto harness integrity tester with switch for testing the functioning of an auto harness from within a moving or non-moving vehicle, comprising:

a. a first housing component located upon a driver's side portion of a dashbaord of a motor vehicle with a first cable through hole in one side thereof with one end side thereof being closed and transparent;

b. coaxial cable carrying within it, a first wire, a second wire, a third wire and a fourth wire;

c. said coaxial cable connected to said first housing component at the locus of said first cable through hole;

d. a second housing component located in a trunk portion of said motor vehicle with three identical front male prongs affixed thereto and originating respectively from each of three through holes at a front side thereof and a front female socket pocket originating from said front side thereof, with three identical rear female socket pockets originating from a rear side thereof and a rear male prong affixed thereto and originating from a through hole in said rear side thereof and with a second cable through hole in one lateral side thereof;

e. said coaxial cable after passing through an interior region of said motor vehicle and then into said trunk portion of said motor vehicle being then and there connected to said second housing component at the locus of said second cable through hole;

f. a fifth wire leading from a metallic base of said front female socket pocket within said second housing component to an interior end of said rear male prong located within said second housing component;

g. a sixth wire leading from an interior end within said second housing component of a first one of said three identical front male prongs to a metallic base of a first one of said identical rear female socket pockets;

h. a seventh wire leading from an interior end within said second housing component of a second one of said three identical front male prongs to a metallic base of a second one of said identical rear female socket pockets;

i. an eighth wire leading from an interior end with said second housing component of a third one of said three identical male prongs to a metallic base of a third one of said identical rear female socket pockets;

j. a first junction whereat said first wire is connected to said sixth wire within said second housing component;
k. a second junction whereat said second wire is connected to said seventh wire within said second housing component;
l. a third junction whereat said third wire is connected to said eighth wire within said second housing component;
m. a fourth junction whereat said fourth wire is connected to said fifth wire within said second housing component;
n. said first wire being connected to a first light emitting diode located within and internally affixed to said first housing component at said end side thereof being closed and transparent;
o. said second wire being connected to a second light emitting diode located within and internally affixed to said first housing component at said end side thereof being closed and transparent;
p. said third wire being connected to a third light emitting diode located within and internally affixed to said first housing component at said end side thereof being closed and transparent;
q. said first light emitting diode being connected via a ninth wire to a first resistor within said first housing component;
r. said second light emitting diode being connected via a tenth wire to a second resistor within said first housing component;
s. said third light emitting diode being connected via an eleventh wire to a third resistor within said first housing component;
t. each of said resistors being connected via a twelfth wire to a first end of an intravehicular off/on testing switch located upon said first housing component;
u. a second end of said intravehicular off/on testing switch being connected to said fourth wire;
v. said resistors being all characterized by resistivity of 1.0 kilohms, and;
w. said light emitting diodes being all characterized by optoelectric current carrying capacity of 10 milliamps.

3. An intravehicular auto harness integrity tester with switch for testing the functioning of an auto harness from within a moving or non-moving vehicle, comprising:
 a. a first housing component located upon a driver's side portion of a dashboard of a motor vehicle with a first cable through hole in one end side thereof with one end side thereof being open;
 b. coaxial cable carrying within it, a first wire, a second wire, a third wire and a fourth wire;
 c. said coaxial cable connected to said first housing component at the locus of said first cable through hole;
 d. a second housing component located in a trunk portion of said motor vehicle with three identical front male prongs affixed thereto and originating respectively from each of three through holes at a front side thereof and a front female socket pocket originating from said front side thereof, with three identical rear female socket pockets originating from a rear side thereof and a rear male prong affixed thereto and originating from a through hole in said rear side thereof and with a second cable through hole in one lateral side thereof;
 e. said coaxial cable after passing through an interior region of said motor vehicle and then into said trunk portion of said motor vehicle and being then and there connected to said second housing component at the locus of said second cable through hole;
 f. a fifth wire leading from a metallic base of said front female socket pocket within said second housing component to an interior end of said rear male prong located within said second housing component;
 g. a sixth wire leading from an interior end within said second housing component of a first one of said three identical front male prongs to a metallic base of a first one of said identical rear female socket pockets;
 h. a seventh wire leading from an interior end within said second housing component of a second one of said three identical male prongs to a metallic base of a second one of said identical rear female socket pockets;
 i. an eighth wire leading from an interior end with said second housing component of a third one of said three identical male prongs to a metallic base of a third one of said identical rear female socket pockets;
 j. a first junction whereat said first wire is connected to said sixth wire within said second housing component;
 k. a second junction whereat said second wire is connected to said seventh wire within said second housing component;
 l. a third junction whereat said third wire is connected to said eighth wire within said second housing component;
 m. a fourth junction whereat said fourth wire is connected to said fifth wire within said second housing component;
 n. said first wire being connected to a first resistor within said first housing component;
 o. said second wire being connected to a second resistor within said first housing component;
 p. said third wire being connected to a third resistor within said first housing component;
 q. said first resistor being connected via a ninth wire to a first light emitting diode located within and internally affixed to said first housing component at said end side thereof being open;
 r. said second resistor being connected via a tenth wire to a second light emitting diode located within and internally affixed to a said first housing component at said end side thereof being open;
 s. said third resister being connected via an eleventh wire to a third light emitting diode located within and internally affixed to said first housing component at said end side thereof being open;
 t. each of said diodes being further connected respectively via a twelfth wire to a first end of an intravehicular off/on testing switch located upon said first housing component;
 u. a second end of said intravehicular off/on testing switch being connected to said fourth wire;
 v. said resistors being all characterized by resistivity of 1.0 kilohms, and;
 w. said light emitting diodes being all characterized by optoelectric current carrying capacity of 10 milliamps.

4. An intravehicular auto harness integrity tester with switch for testing the functioning of an auto harness from within a moving or non-moving motor vehicle, comprising:
 a. a first housing component located upon a driver's side portion of a dashboard of a motor vehicle with a first cable through hole in one end side thereof with one end side thereof being open;

b. coaxial cable carrying within it, a first wire, a second wire, a third wire and a fourth wire;

c. said coaxial cable connected to said first housing component at the locus of said first cable through hole;

d. a second housing component located in a trunk portion of said motor vehicle with three identical front male prongs affixed thereto and originating respectively from each of three through holes at a front side thereof and a front female socket pocket originating from said front side thereof, with three identical rear female socket pockets originating from a rear side thereof and a rear male prong affixed thereto and originating from a through hole in said rear side thereof and with a second cable through hole in one lateral side thereof;

e. said coaxial cable connected after passing through an interior region of said motor vehicle and into said trunk portion of said motor vehicle being then and there connected to said second housing component at the locus of said second cable through hole;

f. a fifth wire leading from a metallic base of said front female socket pocket within said second housing component to an interior end of said rear male prong located within said second housing component;

g. a sixth wire leading from an interior end within said second housing component of a first one of said three identical front male prongs to a metallic base of a first one of said identical rear female socket pockets;

h. a seventh wire leading from an interior end within said second housing component of a second one of said three identical male prongs to a metallic base of a second one of said identical rear female socket pockets;

i. an eighth wire leading from an interior end with said second housing component of a third one of said three identical male prongs to a metallic base of a third one of said identical rear female socket pockets;

j. a first junction whereat said first wire is connected to said sixth wire within said second housing component;

k. a second junction whereat said second wire is connected to said seventh wire within said second housing component;

l. a third junction whereat said third wire is connected to said eighth wire within said second housing component;

m. a fourth junction whereat said fourth wire is connected to said fifth wire within said second housing component;

n. said first wire being connected to a first light emitting diode located within and internally affixed to said first housing component at said end side thereof being open;

o. said second wire being connected to a second light emitting diode located within and internally affixed to said first housing component at said end side thereof being open;

p. said third wire being connected to a third light emitting diode located within and internally affixed to said first housing component at said end side thereof being open;

q. said first light emitting diode being connected via a ninth wire to a first resistor within said first housing component;

r. said second light emitting diode being connected via a tenth wire to a second resistor within said first housing component;

s. said third light emitting diode being connected via an eleventh wire to a third resistor within said first housing component;

t. each of said resistors being connected via a twelfth wire to a first end of an intravehicular off/on testing switch located upon said first housing component;

u. a second end of said intravehicular off/on testing switch being connected to said fourth wire;

v. said resistors being all characterized by resistivity of 1.0 kilohms, and;

w. said light emitting diodes being all characterized by optoelectric current carrying capacity of 10 milliamps.

5. The intravehicular auto harness integrity tester with switch of claim 1, whereby said resistors are characterized by resistivity within a range of 0.70 kilohms to 1.30 kilohms.

6. The intravehicular auto harness integrity tester with switch of claim 2, whereby said resistors are characterized by resistivity within a range of 0.70 kilohms to 1.30 kilohms.

7. The intravehicular auto harness integrity tester with switch of claim 3 whereby said resistors are characterized by resistivity within a range of 0.70 kilohms of 1.30 kilohms.

8. The intravehicular auto harness integrity tester with switch of claim 4 whereby said resistors arc characterized by resistivity within a range of 0.70 kilohms to 1.30 kilohms.

9. The intravehicular auto harness integrity tester with switch of claim 1 whereby said first diode is one color, said second diode is another color different from the color of said first diode and said third diode is a third color different from said color of said first diode and said another color of said second diode.

10. The intravehicular auto harness integrity tester with switch of claim 2 whereby said first diode is one color, said second diode is another color different from the color of said first diode and said third diode is a third color different from said color of said first diode and said another color of said second diode.

11. The intravehicular auto harness integrity tester with switch of claim 3 whereby said first diode is one color, said second diode is another color different from the color of said first diode and said third diode is a third color different from said color of said first diode and said another color of said second diode.

12. The intravehicular auto harness integrity tester with switch of claim 4 whereby said first diode is one color, said second diode is another color different from the color of said first diode and said third diode is a third color different from said color of said first diode and said another color of said second diode.

* * * * *